(12) United States Patent
Shibata et al.

(10) Patent No.: US 8,142,042 B2
(45) Date of Patent: Mar. 27, 2012

(54) LIGHT-EMITTING-DIODE BACKLIGHT DEVICE

(75) Inventors: Hirokazu Shibata, Tokyo (JP); Yuichi Suzuki, Kanagawa (JP)

(73) Assignee: Sony Corporation, Tokyo (JP)

( * ) Notice: Subject to any disclaimer, the term of this patent is extended or adjusted under 35 U.S.C. 154(b) by 93 days.

(21) Appl. No.: 12/402,829

(22) Filed: Mar. 12, 2009

(65) Prior Publication Data
US 2009/0231881 A1    Sep. 17, 2009

(30) Foreign Application Priority Data
Mar. 13, 2008 (JP) ................. P2008-064450

(51) Int. Cl.
*G09F 13/08* (2006.01)
(52) U.S. Cl. ............... 362/97.3; 362/294; 362/373
(58) Field of Classification Search ............. 362/97.3, 362/249.02, 373, 218, 294
See application file for complete search history.

(56) References Cited

U.S. PATENT DOCUMENTS

| | | | | |
|---|---|---|---|---|
| 7,140,753 B2 * | 11/2006 | Wang et al. | ............ | 362/294 |
| 7,284,874 B2 * | 10/2007 | Jeong et al. | ............ | 362/97.1 |
| 7,431,475 B2 * | 10/2008 | Hafuka et al. | ............ | 362/218 |
| 2006/0072344 A1 * | 4/2006 | Kim et al. | ............ | 362/632 |
| 2006/0133090 A1 * | 6/2006 | Noh et al. | ............ | 362/294 |
| 2006/0203510 A1 * | 9/2006 | Noh et al. | ............ | 362/580 |
| 2006/0262559 A1 * | 11/2006 | Chen | ............ | 362/614 |
| 2007/0076431 A1 * | 4/2007 | Atarashi et al. | ............ | 362/613 |
| 2007/0211205 A1 * | 9/2007 | Shibata | ............ | 349/161 |
| 2007/0230185 A1 * | 10/2007 | Shuy | ............ | 362/294 |
| 2009/0027888 A1 * | 1/2009 | Yu et al. | ............ | 362/294 |

FOREIGN PATENT DOCUMENTS

| | | |
|---|---|---|
| JP | 2005-317480 | 11/2005 |
| JP | 2006-58487 | 3/2006 |
| JP | 2006-227072 | 8/2006 |
| JP | 2006-302581 | 11/2006 |
| JP | 2006-340214 | 12/2006 |
| JP | 2007-335371 | 12/2007 |

* cited by examiner

*Primary Examiner* — Julie Shallenberger
(74) *Attorney, Agent, or Firm* — Finnegan, Henderson, Farabow, Garrett & Dunner, L.L.P.

(57) ABSTRACT

A light-emitting-diode backlight device includes a light source substrate to which many light-emitting diodes are mounted, and a bottom chassis having the light source substrate mounted to a principal surface side of the bottom chassis. Illumination light from the light-emitting diodes is supplied to a display panel unit. A back-surface side of the bottom chassis is provided with a heat-dissipating unit making uniform a temperature distribution over the entire bottom chassis. The heat-dissipating unit includes a mounting plate, a heat pipe, and a radiating fin. The mounting plate is mounted to at least a high-temperature area of the bottom chassis. The heat pipe is disposed on both the high-temperature area and a low-temperature area, and is mounted to the mounting plate. The radiating fin is mounted to the low-temperature area, and connected to an end of the heat pipe.

7 Claims, 8 Drawing Sheets

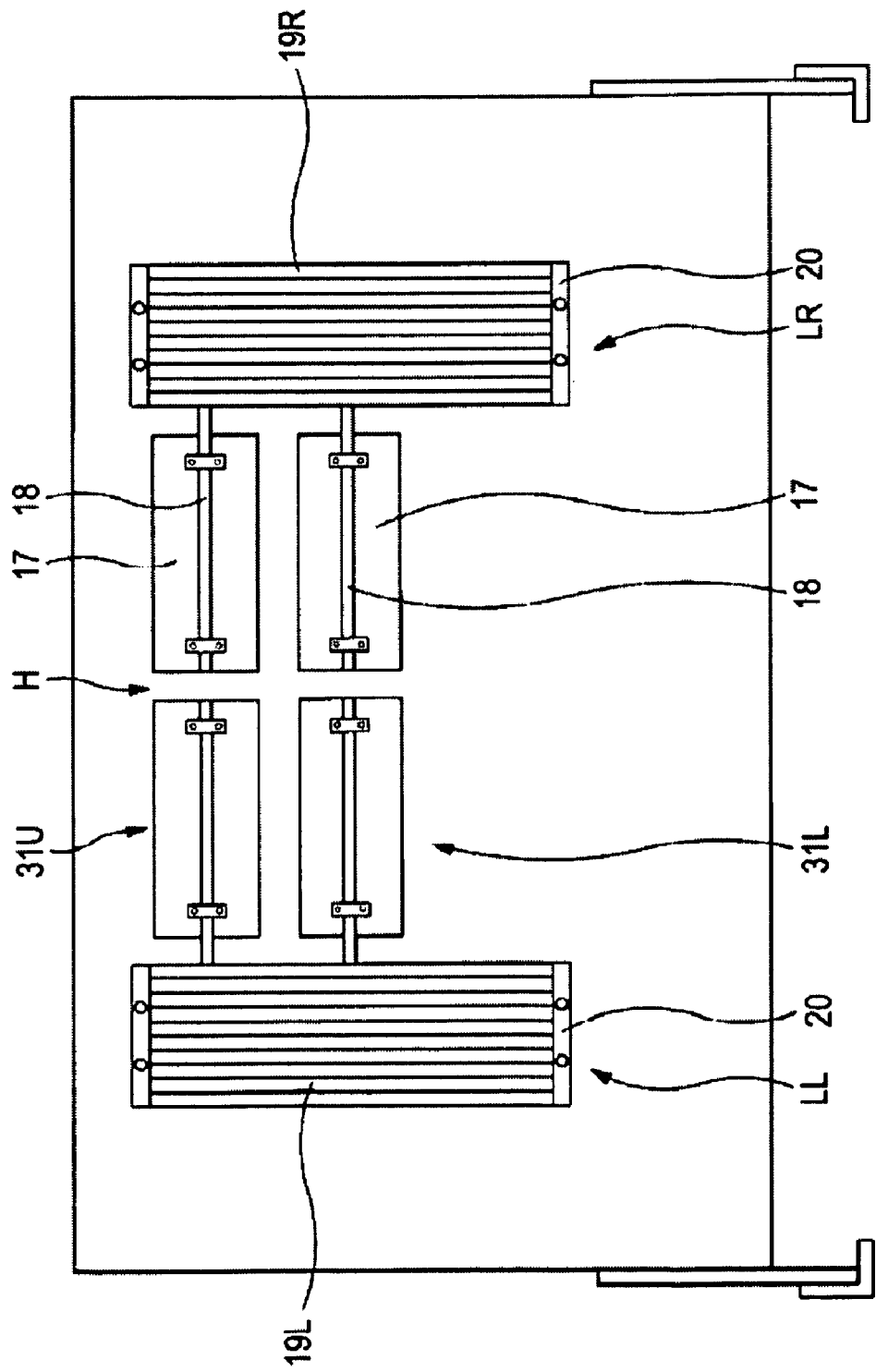

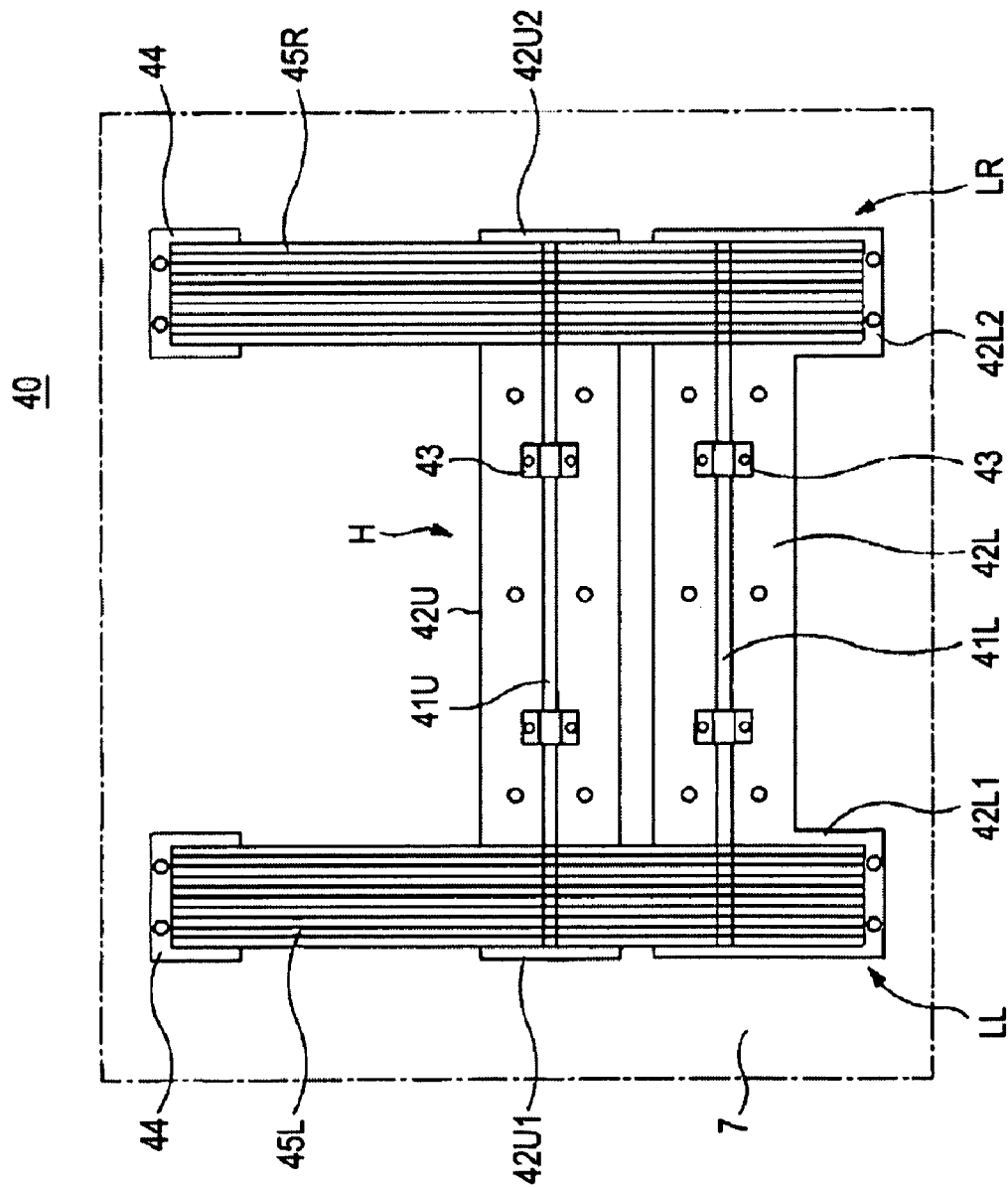

LIGHT-EMITTING-DIODE BACKLIGHT DEVICE

CROSS REFERENCES TO RELATED APPLICATIONS

The present invention contains subject matter related to Japanese Patent Application JP 2008-064450 filed in the Japanese Patent Office on Mar. 13, 2008, the entire contents of which are incorporated herein by reference.

BACKGROUND OF THE INVENTION

1. Field of the Invention

The present invention relates to an LED backlight device in which a many light emitting diodes (LEDs) serve as light sources.

2. Description of the Related Art

An LED backlight device is, for example, assembled to a display panel (such as a liquid display panel), and illumination light emitted from each LED is supplied to a display panel unit, to form a display device. Compared to, for example, a cold cathode fluorescent lamp (CCFL), which is generally used as a light source in a related art, the LED backlight device is provided with many LEDs which are low in cost and which have various characteristics, such as being small in size/being light, having low electrical power consumption, or high luminance, so that image display of high luminance is performed even for a large display device.

In the LED backlight device, improvement in each LED has caused an increase in the luminance and a reduction in an individual heat value. However, by providing the LED backlight device with more LEDs due to an increase in the size of the display device, its overall heat value is also large. In addition, in the LED backlight device, since a light-guiding space, which is externally shielded from light, is formed at a back-surface side of the display panel unit for assembly of the LED backlight device, heat generated from each LED is confined in the light-guiding space in a sealed state. Therefore, the overall temperature is high.

In the LED backlight device, the chromaticity of each LED may become an improper value or the life of each LED may be reduced due to light-emission characteristics of each LED becoming unstable under a high-temperature environment. In the LED backlight device, in particular, a reduction in light-emission efficiency of a red LED under a high-temperature environment is reduced, thereby reducing color reproducibility. The effect of higher temperature in the display device not only gives rise to the aforementioned problems in the LED backlight device, but also gives rise to problems such as reducing the life and deteriorating the characteristics of, for example, an integrated circuit device or electronic components mounted to various circuit unit substrates.

With regard to the problem of the LED backlight device, the applicant has provided heat-dissipating devices. Each of these heat-dissipating devices restricts a rise in temperature of the entire backlight device by efficiently dissipating heat generated from, for example, a circuit block or heat generated from each LED. The heat is efficiently dissipated using a heat pipe having a very high heat conveyance efficiency. (Refer to, for example, Japanese Unexamined Patent Application Publication Nos. 2005-317480 and 2006-58487.)

Each of these heat-dissipating devices of the previous applications is formed by connecting a heat-conveying unit to a heat-dissipating unit. The heat-conveying unit for generating heat is formed by mounting an aluminum heat-dissipating plate to the back surface of a wiring board (on which many LEDs are disposed in lines and are mounted) and by mounting a heat pipe to the heat-dissipating plate. The heat-dissipating unit includes a heat sink and a cooling fan and is disposed at a side of a bottom chassis. In each of the heat-dissipating devices of the previous applications, the heat generated from, for example, each LED is efficiently conveyed to a side by the heat pipe through the heat-dissipating plate, and the heat sink and the cooling fan efficiently dissipate the heat to the outside for efficient cooling. This reduces the overall temperature rise, so that each LED is stably driven.

SUMMARY OF THE INVENTION

In each of the heat-dissipating devices of the previous applications, as mentioned above, the LED backlight device is provided with many LEDs that generate a considerable amount of heat, and the heat conveying unit (including the heat-dissipating plate and the heat pipe) is disposed at the back-surface side of a light-source substrate (on which each LED serving as a heat-generating source is mounted) so as to face a mounting area of each LED. In each of the heat-dissipating devices of the previous applications, the heat generated from the mounting area of each LED (serving as a heat-generating source) is directly conveyed to the heat-dissipating unit for efficient cooling, so that the overall temperature rise is restricted.

In each of the heat-dissipating devices of the previous applications, the generated heat conveyed by the heat pipe is efficiently dissipated to the outside by the heat sink and the cooling fan, which is a large component. In addition, in each of the heat-dissipating devices of the previous applications, many relatively expensive heat pipes, and a heat sink and a cooling fan, which are large, heavy, and expensive, are provided. Therefore, costs, size, and weight are increased.

In the LED backlight device, due to technical progress, as with a circuit block, etc., LEDs having low electrical power consumption characteristics, a long life, high luminance characteristics, etc., and generating a smaller amount of heat have been developed. This makes it possible to reduce the size of the heat-dissipating unit. A reduction in the cost of a main body device (display device) has caused a demand for a considerable reduction in the cost of the LED backlight device. Accordingly, realizing a heat-dissipating unit which is smaller, lighter, and lower in cost is becoming important.

The inventor et al. have repeatedly conducted keen examinations on the LED backlight device. The results have made us focus attention on the fact that, regardless of the size, a particular portion of a bottom chassis (that is, a slightly upward portion of a central area of the bottom chassis) becomes a high-temperature area, and peripheral areas close to respective corners become relatively low-temperature areas, so that, overall, a temperature distribution in a driving state (turned on state) of each LED is not uniform. In the LED backlight device, heat generated from each LED, an electronic component of a circuit block, etc., causes convection to occur in the interior of the LED backlight device. This causes hot air to flow to the central area, as a result of which the central area becomes a high-temperature area. In addition, in the LED backlight device, natural heat dissipation occurs at the peripheral areas facing the outside, thereby restricting a rise in temperature, as a result of which the peripheral areas become areas having relatively low temperatures. Further, in the LED backlight device, the heat is dissipated in two directions, in particular, at the corners, so the temperature of the low-temperature areas is further reduced.

In the LED backlight device, for achieving uniform color reproducibility over an entire screen, the color temperature of the many LEDs needs to be uniform overall. In the related LED backlight device, heat is efficiently dissipated directly from the areas where the LEDs (serving as heat-generating sources) are mounted, to restrict an overall temperature rise. In addition, in the LED backlight device, it is possible to make the temperature distribution uniform over the entire LED backlight device by reducing differences between the temperature distribution at the central area and the temperature distribution at the peripheral areas.

Accordingly, it is desirable to provide an LED backlight device which is reduced in cost and which can achieve uniform color reproducibility over an entire screen, by efficiently dissipating heat in accordance with temperature distribution variations using a simple heat dissipation structure.

According to an embodiment of the present invention, there is provided a light-emitting-diode backlight device including a light source substrate to which many light-emitting diodes are mounted, and a bottom chassis having the light source substrate mounted to a principal surface side of the bottom chassis. Illumination light emitted from each of the light-emitting diodes at the light source substrate is supplied to a display panel unit. In the light-emitting diode backlight device, a back-surface side of the bottom chassis is provided with heat-dissipating means which makes uniform a temperature distribution over the entire bottom chassis. In addition, in the light-emitting-diode backlight device, the heat-dissipating means includes a mounting plate, a heat pipe, and a radiating fin, the mounting plate being mounted to at least, for example, a central area corresponding to a high-temperature area of the bottom chassis, the heat pipe being disposed on both the high-temperature area and, for example, a peripheral area corresponding to a low-temperature area of the bottom chassis and being mounted to the mounting plate, the radiating fin being mounted to the low-temperature area and being connected to an end of the heat pipe.

In the LED backlight device, heat is efficiently conveyed from, for example, the central area (which becomes the high-temperature area of the bottom chassis due to concentration of the heat resulting from internal convection caused by the heat generated from, for example, an electronic component and the many LEDs) to, for example, the peripheral area (which becomes, for example, the low-temperature area) through the mounting plate and the heat pipe. The heat is dissipated from a radiating fin having high heat-dissipation efficiency and provided at the low-temperature area, to cool the high-temperature area. In the LED backlight device, the heat-dissipating means performs partial heat dissipation on a most effective portion. Therefore, the number of heat pipes is reduced, and a cooling fan and a heat sink, which are large and expensive, are not required. Consequently, a predetermined heat-dissipation operation is performed with only the radiating fin having high heat-dissipation efficiency and being low in cost. As a result, in the LED backlight device, the temperature distribution variations are reduced, so that, overall, the color temperature of each LED is made uniform, thereby allowing an image to be displayed with high color reproducibility.

According to the LED backlight device of the embodiment of the present invention, heat is efficiently conveyed from the high-temperature area to the low-temperature area of the bottom chassis through the mounting plate and the heat pipe, and the heat is efficiently dissipated from the radiating fin at the low-temperature area, to reduce the temperature distribution variations. This causes the color temperature of each LED to become uniform overall, so that an image can be displayed with high color reproducibility. According to the LED backlight device, even if the number of heat pipes is reduced and the heat pipe is thin and light, the heat is efficiently dissipated by the heat-dissipating means including the radiating fin having high heat-dissipation efficiency. Therefore, it is possible to considerably reduce costs, and make the LED backlight device thinner and lighter.

BRIEF DESCRIPTION OF THE DRAWINGS

FIG. 6 illustrates an experimental model including heat-dissipating units;

FIG. 7 is a rear view of a main portion of a heat-dissipating unit according to a second embodiment of the present invention.

DESCRIPTION OF THE PREFERRED EMBODIMENTS

Figure 1:
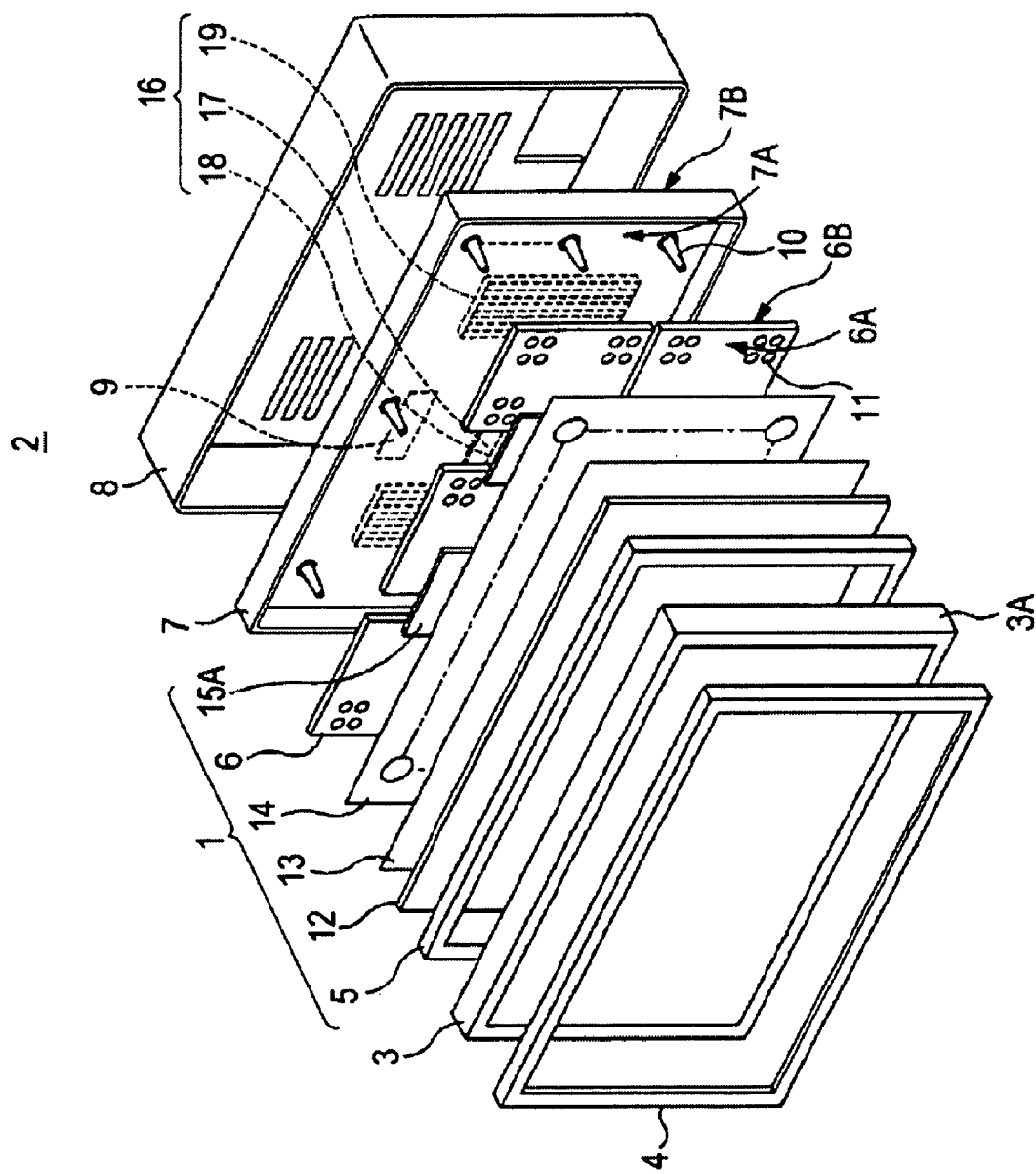
FIG. 1 is an exploded perspective view of a main portion of a liquid crystal color display device according to an embodiment of the present invention.

A large liquid crystal color display device (hereunder simply referred to as the "liquid crystal display device") 2 including an LED backlight unit (hereunder simply referred to as the "backlight unit") 1 as an LED backlight device according to an embodiment of the present invention will be described in detail with reference to the drawings. The liquid crystal display device 2 is used in, for example, a television receiver or various display monitor devices. As shown in FIG. 1, in the liquid crystal display device 2, a front chassis (bezel) 4 is assembled to a front-surface side of a liquid crystal panel unit 3, and the backlight unit 1 (which supplies illumination light) is assembled to a back-surface side of liquid crystal panel unit 3.

In the liquid crystal display device 2, the liquid crystal panel unit 3 and the backlight unit 1 are assembled to each other in a stacked state through a middle chassis 5, and the stacked member is assembled to a bottom chassis 7. Further, the resulting stacked structure is covered to assemble outer peripheral edges thereof to a back cabinet 8, which abuts upon the bezel 4. In the liquid crystal display device 2, a circuit board 15 (see FIG. 3) is mounted to a back-surface side of the bottom chassis 7. In addition, although not described in detail, the back cabinet 8 is provided with a heat-dissipation slit or an opening allowing, for example, an operating section of a control box or a connector unit to face the outside. The connector unit is used to connect a power supply cord, an antenna cable, or an external connection cable. The bezel 4 and the back cabinet 8 constitute an exterior portion of the liquid crystal display device 2.

In the liquid crystal display device 2, the circuit board 15 includes, for example, a power-supply circuit unit, or a control circuit unit, or a transmission-reception circuit unit or a driving circuit unit. Although not shown, the liquid crystal display device 2 is set at, for example, a floor surface by assembling its bottom portion to a stand having an appropriate structure through a stay. A pair of left and right built-in speaker units is also assembled to the liquid crystal display device 2 on respective left and right sides of the liquid crystal panel unit 3.

In the liquid crystal panel unit 3, as is well known, a non image display area and an effective display area are provided. The non image display area is provided when an outer peripheral area having a predetermined width and extending along an outer peripheral portion of the liquid crystal panel unit 3 is defined as an electrode draw-out area. An area surrounded by the non image display area is the image effective display area. In the liquid crystal panel unit 3, a frame 3A (which holds the structural members in a stacked state) is fitted to the outer peripheral area thereof, and is secured to a front frame disposed at a bezel-4 side, and the image effective display area is made to face the outside, so that the frame 3A surrounds an outer periphery of the image effective display area.

In the liquid crystal panel unit 3, as is well known, a space between a first glass substrate and a second glass substrate is filled with liquid crystals. The first glass substrate and the second glass substrate are kept at a predetermined from each other by, for example, a spacer bead so as to oppose each other. In addition, in the liquid crystal panel unit 3, a stripe-like transparent electrode, an insulation film, and an alignment film are formed on the inner surface of the first glass substrate; and color filters for three primary colors of light, an overcoat layer, a stripe-like transparent electrode, and an alignment film are formed on the inner surface of the second glass substrate. Further, in the liquid crystal panel unit 3, a deflection film and a retardation film are joined to the surface of each of the first and second glass substrates.

In the liquid crystal panel unit 3, driving voltages are applied to the liquid crystals through each of the transparent electrodes from a driving control unit 9 mounted to the bottom chassis 7 (described later), to change the orientations of liquid crystal molecules. This changes light transmittance of illumination light supplied from the backlight unit 1. In addition, in the liquid crystal panel unit 3, the alignment films (formed of polyimide) are disposed horizontally with the liquid crystal molecules being defined as an interface. The deflection films and the retardation films cause wavelength characteristics to become achromatic characteristics and whitening characteristics. The color filters, which can provide a full-color image, are used to display, for example, a color image. Obviously, the liquid crystal panel unit 3 is not limited to that having the above-described structure.

Figure 2:
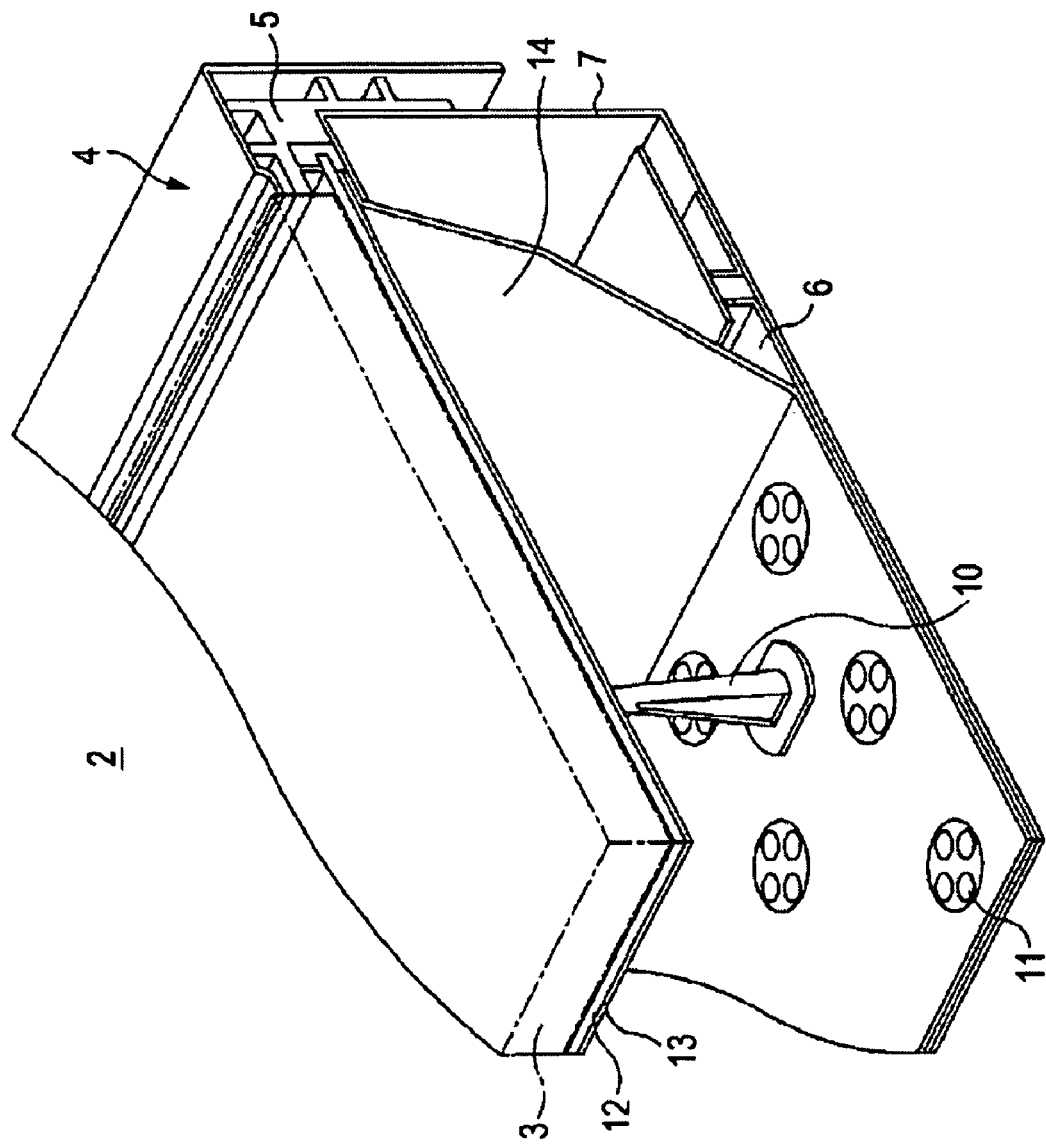
FIG. 2 is a perspective view of the main portion illustrating an internal structure of a backlight unit.

The backlight unit 1 includes a light-guiding unit. The light-guiding unit efficiently supplies illumination light emitted from each LED 11, mounted to a light source substrate 6 (described later), to the liquid crystal panel unit 3. As shown in FIG. 2, a plurality of stud members 10 (provided on the bottom chassis 7) are abutted upon the light-guiding unit to make it oppose and to keep it at a predetermined distance from the bottom chassis 7 over the entire surface of the back-surface-side of the liquid crystal panel unit 3, and to form a light-guiding space between the backlight unit 1 and the bottom chassis 7.

The light-guiding unit includes, for example, an optical sheet member 12, a diffusion plate 13, and a reflecting sheet 14, which are assembled to each other in a stacked state. In the light-guiding unit, the size of the reflecting sheet 14 is substantially the same as the size of the liquid crystal panel unit 3. As shown in FIG. 2, each LED 11 faces the interior of the light-guiding space through an opening. This makes it possible to prevent leakage of the illumination light emitted from each LED 11 to the surroundings, and to reflect and efficiently supply the illumination light to the diffusion plate 13.

In the light-guiding unit, with the diffusion plate 13 diffusing the illumination light over the entire surface thereof, the illumination light is supplied to the optical sheet member 12. In addition, in the light-guiding unit, the optical sheet member 12 performs a predetermined optical operation on the supplied illumination light, to supply the resulting illumination light to the liquid crystal panel unit 3. The optical sheet member 12 is formed by stacking upon each other, for example, an optical sheet member which separates the illumination light into an orthogonal component and an optical sheet member which prevents coloring or widens a viewing angle by compensating for a phase difference of the illumination light, or a reflecting sheet member and a diffusion sheet member (which diffuses the illumination light). The optical sheet member 12 is not limited to the stacked structure of the aforementioned optical sheet members. For example, another optical sheet member may include, for example, two light diffusion sheets having a luminance increasing film, a retardation film, or prism sheet interposed therebetween. The light-guiding unit diffuses the illumination light over the entire surface thereof, to supply the illumination light having a substantially uniform luminance to the liquid crystal panel unit 3.

In the backlight unit 1, the light source substrate 6 is divided into a plurality of substrate portions in accordance with the size of the liquid crystal panel unit 3. A first principal surface 6A facing the liquid crystal panel unit 3 is provided with, for example, many LEDs 11 and an input-output connector (not shown). The LEDs 11 include an appropriate combination of red LEDs 11R, green LEDs 11G, and blue LEDs 11B. The first principal surface 6A of the light source substrate 6 is provided with many LED mounting lands (not shown) in a predetermined arrangement. The LEDs 11 are mounted to the LED mounting lands, respectively. Although not shown in detail, a second principal surface 6B of the light source substrate 6 is provided with, for example, predetermined wiring patterns and lands to mount various electronic components thereto. Driving circuit boards 15A for the LEDs 11 are mounted on the respective substrate portions.

In the backlight unit 1, a driving voltage is applied to each LED 11 from its corresponding driving circuit, so that each LED 11 emits illumination light, which is supplied to the light-guiding unit through the light-guiding space. In addition, in the backlight unit 1, as shown in FIG. 2, the red LEDs 11R, the green. LEDs 11G, and the blue LEDs 11B are mounted in an annular arrangement to the light source substrate 6. However, the arrangement is obviously not limited thereto. In addition, the number of LEDs 11 to be mounted is appropriately set in accordance with the size of the liquid crystal panel unit 3.

In the liquid crystal display device 2, the bottom chassis 7 (which supports each structural component, such as the backlight unit 1 and the liquid crystal panel unit 3, and which constitutes a mechanical structure) is formed of, for example, a light aluminum sheet plate having good thermal conductivity, good mechanical processability, and mechanical rigidity, or a metallic material having characteristics that are equivalent thereto. Although not described in detail, the bottom chassis 7 is supported at a central portion thereof through the stay with reference to the studs, and is positioned and secured at its upper-side portion to an upper frame portion of the bezel 4 through a top bracket member.

Figure 3:
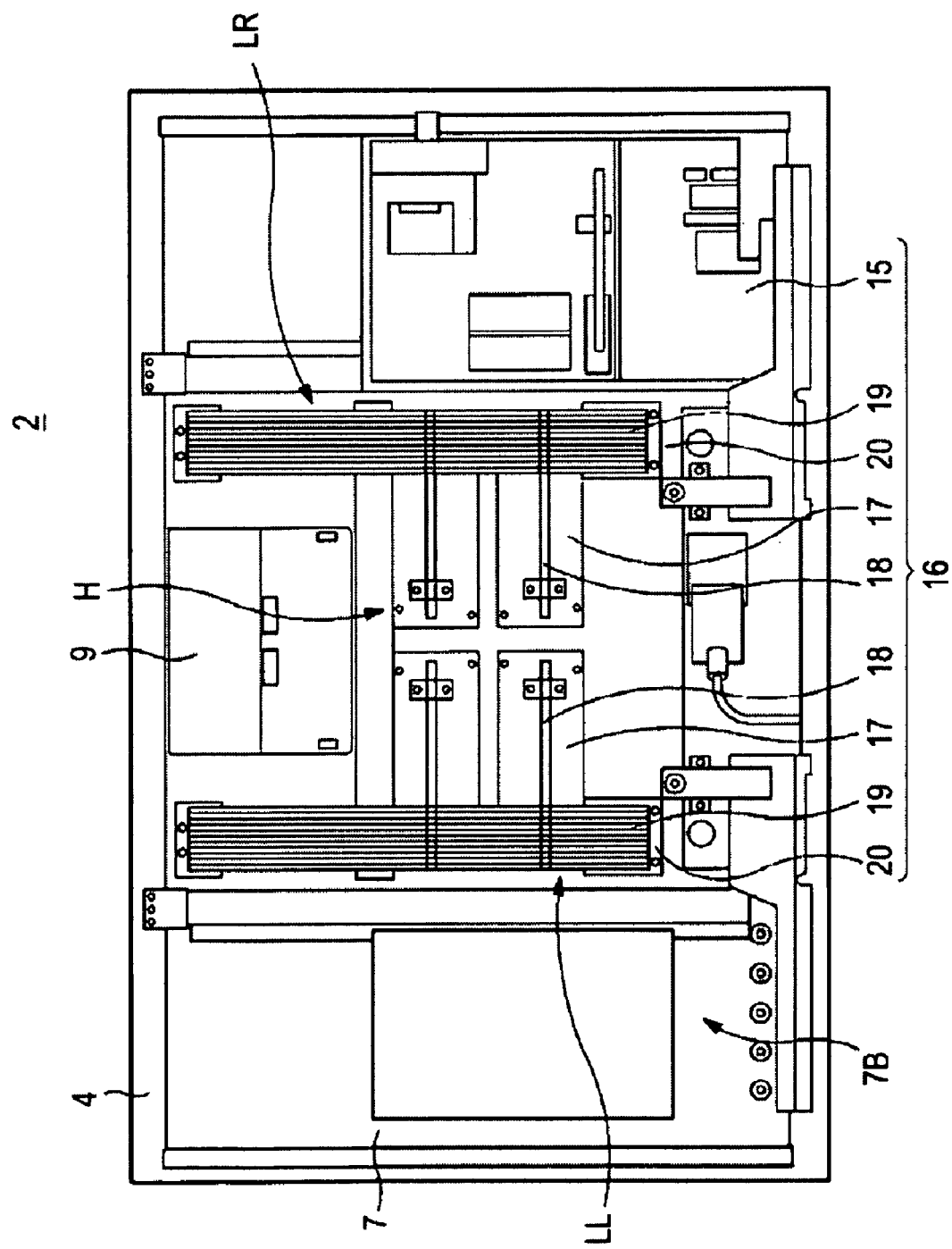
FIG. 3 is a rear view of the main portion of the liquid crystal color display device, for illustrating the structure of heat-dissipating units.

In the bottom chassis 7, as mentioned above, a first principal surface 7A (constituting the surface of mounting the backlight unit 1) is provided with the many stud members 10 and has the light source substrate 6 of the backlight unit 1 mounted thereto. When the light source substrate 6 is secured to appropriate locations of the bottom chassis 7 with, for example, a plurality of metallic setscrews, the bottom chassis 7 is firmly mounted to the light source substrate 6, and heat is transmitted from the light source substrate 6. As shown in FIG. 3, the circuit boards 15, such as various control circuit boards or electronic-component mounting boards having mounted thereto, for example, various switches or various connectors (such as an external connection connector or a power supply connector), are mounted to the bottom chassis 7.

In the liquid crystal display device 2, as mentioned above, the liquid crystal panel unit 3 has an electrode draw-out area having, many draw-out electrodes along the upper edge and the lower edge thereof, so that, through the draw-out electrodes, input-output signals (driving voltages) output from the driving control unit 9 are transmitted and received. Therefore, in the liquid crystal display device 2, the driving control unit 9 is mounted to the bottom chassis 7 so as to oppose a portion of an upper edge or a lower edge near the electrode draw-out area of the liquid crystal panel unit 3, thereby shortening the wiring portions to restrict, for example, superimposed noise at the wiring portions. In addition, in the liquid crystal display device 2, higher performance of the liquid crystal panel unit 3, such as controlling a residual image, has caused the driving control unit 9 to increase in size, thereby increasing heating value. Therefore, efficient heat dissipation of the driving control unit 9 whose setting position, along with the heating value of the LEDs 11, is limited is becoming important.

In the liquid crystal display device 2, internal convection occurs due to heat generated from, for example, the driving control unit, the electronic components mounted to the circuit boards 15, or the LEDs 11 mounted to the light source substrate 6 of the backlight unit 1, as a result of which the heat is concentrated at a central area H of the bottom chassis 7, thereby causing the central area H to become a high-temperature area. In the liquid crystal display device 2, natural heat dissipation occurs at, for example, a left peripheral area LL or a right peripheral area LR (hereunder simply referred to as the "peripheral areas L") to restrict a rise in temperature, so that these peripheral areas L become low-temperature areas. The peripheral areas LL and LR face the outer portion of the bottom chassis 7. In the liquid crystal display device 2, as mentioned above, this phenomenon occurs in common regardless of the size thereof.

In the liquid crystal display device 2, although, particularly speaking, a range depends upon the heating value, the difference between the temperatures of the peripheral areas L and the central area H of the bottom chassis 7 is, for example, approximately 20° C. for a 46-inch size. In the backlight unit 1, heat is efficiently dissipated from the central area H by providing heat-dissipating units 16 (described in detail later) at the bottom chassis 7, so that, overall, the temperature distribution variations are reduced. As a result, overall, the color temperature of each LED 11 is made uniform, so that it is possible to display an image with high color reproducibility. In the backlight unit 1, the overall internal temperature of the bottom chassis 7 is also reduced by efficient dissipation of heat from the central area H by the heat-dissipating units 16, so that the characteristics of the LEDs 11 and the various electronic components are stabilized, and the lives thereof are increased.

In the liquid crystal display device 2, as mentioned above, the central area H of the bottom chassis 7 becomes a high-temperature area due to concentration of heat resulting from internal convection. However, even corresponding areas of the circuit boards 15 and the driving control unit 9 (having, for example, electronic components having high heating values mounted thereto) partly become high-temperature areas. In the backlight unit 1, the heat-dissipating units 16 (described later) can partly dissipate the heat of these high-temperature areas in addition to dissipating the heat of the central area H.

In the backlight unit 1, as shown in FIG. 3, the heat-dissipating units 16 include a plurality of mounting plates 17, heat pipes 18, and a left radiating fin 19L and a right radiating fin 19R (hereunder generically referred to as the "radiating fins 19"), all of which are mounted to the second principal surface 7B of the bottom chassis 7. Pairs of left and right heat-dissipating units 16L and 16R (hereunder generically referred to as the "heat-dissipating units 16") are disposed on the left and the right sides of the central area H. As described in detail below, in the heat-dissipating units 16, the heat pipes 18 are mounted to the respective mounting plates 17, and ends of the heat pipes 18 are connected to the radiating fins 19. Heat conveyed by each heat pipe 18 is dissipated by each radiating fin 19.

Similarly to the aforementioned bottom chassis 7, each mounting plate 17 of the heat-dissipating units 16 is formed of an extruded aluminum component, made of an aluminum material having high thermal conductivity, or a metallic material having an equivalent characteristic. Each mounting plate 17 has a horizontally long, rectangular shape having a length extending from the central portion to the peripheral portions of the bottom chassis 7. Each mounting plate 17 may be formed of, for example, an aluminum alloy, a magnesium alloy, a silver alloy, or a copper material. Each mounting plate 17 may be formed by an appropriate processing method, such as a sheet-metal processing method, a pressing method, or a cutting-out method. As shown in FIG. 3, the mounting plates 17 are each secured at a plurality of locations to the bottom chassis 7 with metallic setscrews, and are mounted horizontally and parallel to each other on the left and right peripheral areas L (LL, LR), respectively, from the central area H.

Each heat pipe 18 in close contact with the principal surface is mounted to its corresponding mounting plate 17. As is well known, each heat pipe 18 has a pipe body made of a material, such as copper, having high thermal conductivity. An inside wall of each pipe body is provided with a capillary structure (wick). The interior of each pipe body in a substantially vacuous state is filled with operating fluid. Each heat pipe 18 is used as a member that efficiently conducts heat in a heat-dissipation structure including various electronic devices. In addition, each heat pipe 18 conducts heat with high efficiency by repeating an operation of discharging heat by evaporating working liquid at a high-temperature side, moving the resulting gas towards a low-temperature side, and liquefying the resulting gas at the low-temperature side, and an operation of moving the resulting liquid again towards the high-temperature side by capillary phenomenon in the wick. Even if the temperature difference is on the order of ±1° C., each heat pipe 18 can conduct heat.

Figure 4:
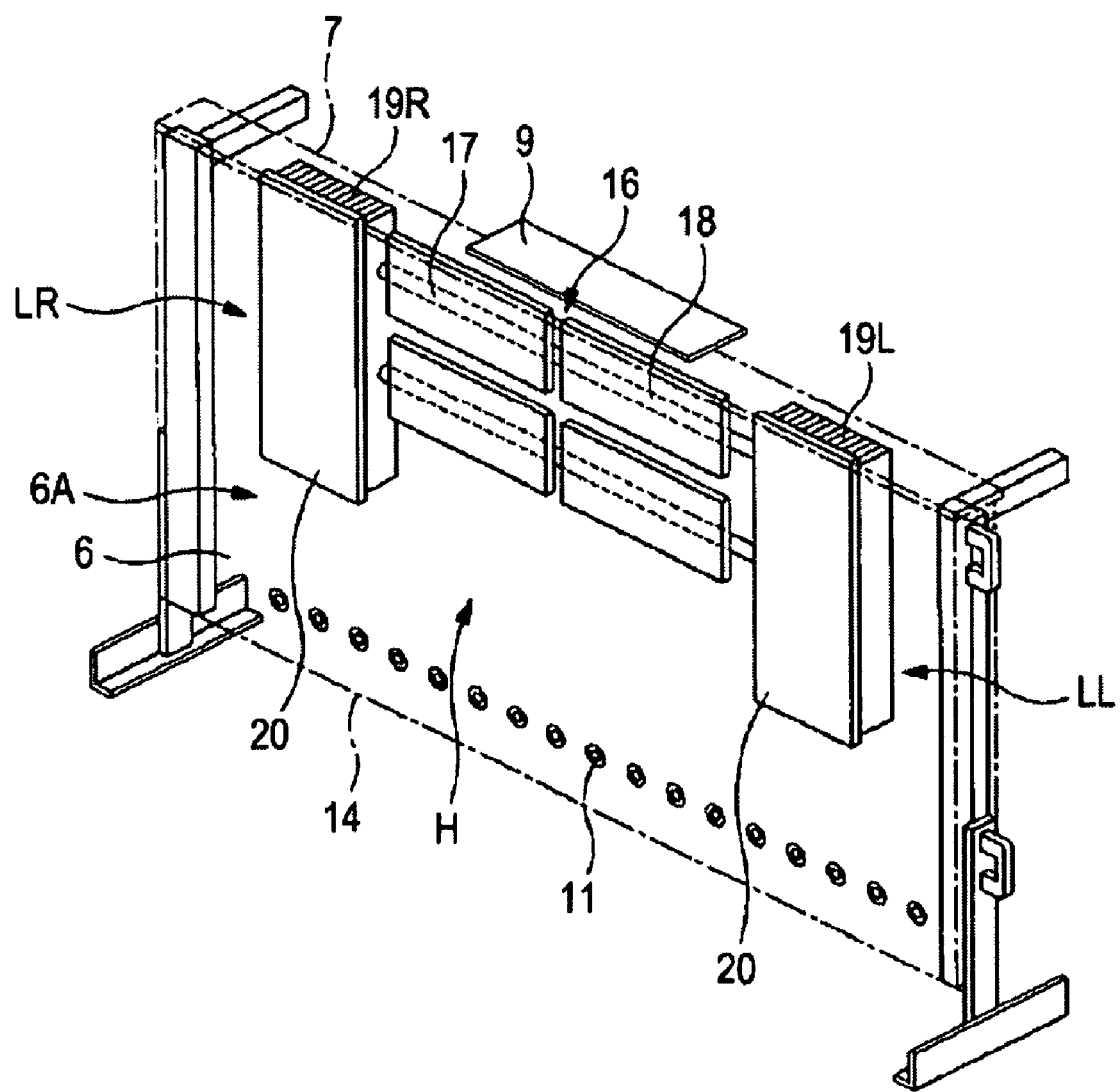
FIG. 4 is a perspective view of the main portion illustrating the structure of the heat-dissipating units.

In the heat-dissipating units 16, the radiating fins 19 are formed by assembling many rectangular plates to respective fin mounting plates 20 (formed of, for example, aluminum sheet metal) as shown in FIG. 4. The many fins are formed by punching an aluminum sheet metal (having characteristics equivalent to those of the bottom chassis 7 and the mounting plates 17) by, for example, a pressing operation. Although not described in detail, the many radiating fins 19 are assembled and integrated to the fin mounting plates 20 on the principal surface at one end so as to oppose each other and so as to be disposed apart from each other by a predetermined distance in a thickness direction thereof. When the radiating fins 19 are stacked upon each other by a simple processing operation, the radiating fins 19 have an overall larger surface area and provide good heat-dissipation characteristics compared to those of an aluminum sheet metal product or an aluminum die-cast product having a large thickness.

Figure 5A:
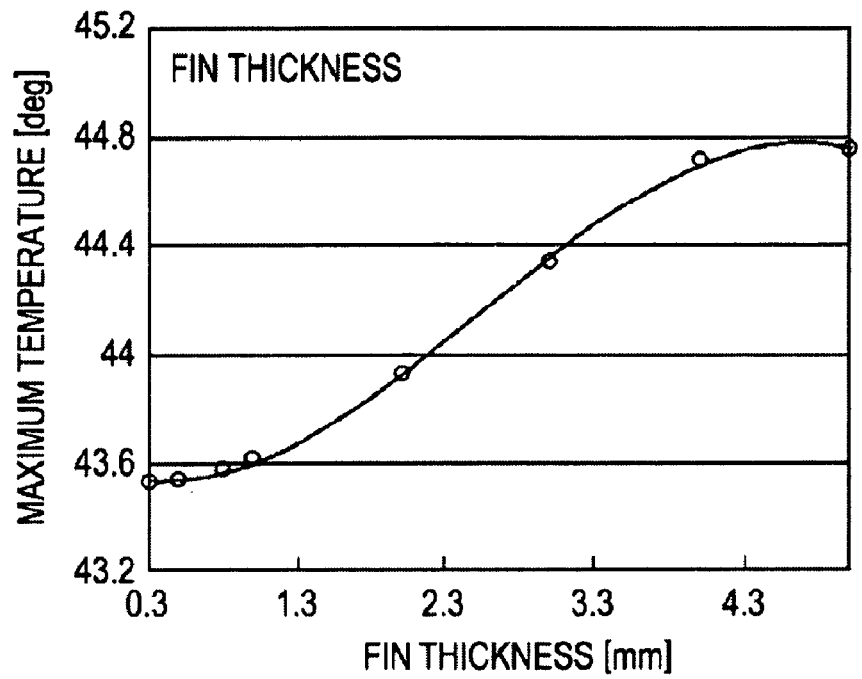
FIGS. 5A and 5B are characteristic views of radiating fins.
Figure 5B:
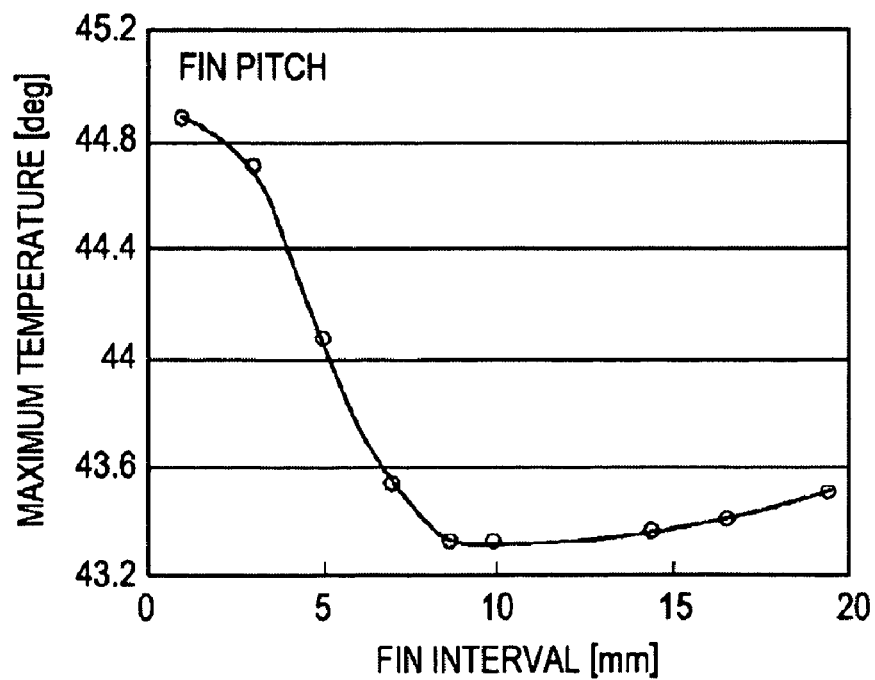

The radiating fins 19 each dissipate heat by conveying the heat from the central area H of the bottom chassis 7 by the mounting plates 17 and the heat pipes 18. The thickness and pitch of each of the fins 19 are determined on the basis of a required heat-dissipation amount. The relationship between a maximum temperature (° C.) of heat-dissipation amount and thickness (mm) when the height of each of the fins 19 is constant is as shown in FIG. 5A. Similarly, the relationship between the maximum temperature (° C.) of heat-dissipation heating value and pitch (mm) when the height of each of fins 19 is constant is as shown in FIG. 5B. As is clear from these graphs, for the radiating fins 19, it is effective to use fins whose thickness becomes larger as the maximum temperature of heat-dissipation heating value is increased. In addition, it is desirable to use fins disposed at a certain pitch. When the thickness of each of the radiating fins 19 is increased, the weight thereof is increased, and when the pitch between the radiating fins 19 is increased, the overall size of the radiating fins 19 is increased. Therefore, these values are optimally set in accordance with the required heat-dissipation heating value.

As shown in FIG. 4, each fin mounting plate 20 includes a member that integrally forms the central portion of each fin, and a member that integrally forms the top end and the bottom end of the fin stacked body and that constitutes a mounting member to the bottom chassis 7. This reduces the weight of each fin mounting plate 20. Since each fin mounting plate 20 also properly conducts heat from the bottom chassis 7 due to its material characteristics, it may be formed of, for example, an integrated member or a member that is L-shaped in cross section and that can be assembled to two sides of the fin stacked body. Although not described in detail, the radiating fins 19 are provided with fitting holes whose axial lines are aligned with respect to each other while the fins are integrated to the fin mounting plates 20. The heat pipes 18 whose ends are tightly fitted to the fitting holes extend through these fitting holes to orthogonally connect the heat pipes 18 thereto.

As shown in FIGS. 3 and 4, in the heat-dissipating units 16, the mounting plates 17 are arranged in a height direction and mounted horizontally at the second principal surface 7B of the bottom chassis 7 so that, at the central portion of the bottom chassis 7, ends of the mounting plates 17 oppose each other and so that the mounting plates 17 extend from the central area H to the left peripheral area LL and the right peripheral area LR (hereunder simply refereed to as the "peripheral areas L"). That is, in the heat-dissipating units 16, the heat pipes 18 are disposed on the second principal surface 7B of the bottom chassis 7 so as to be provided at the central area H and the left and right peripheral areas L through the respective mounting plates 17. In the heat-dissipating units 16, the left and right fin mounting plates 20 oppose and are mounted to the second principal surface 7B of the bottom chassis 7 on the left and right peripheral areas L, provided on respective sides of the central area H, in the height direction. That is, the heat-dissipating units 16 are disposed on the left and right peripheral areas L of the second principal surface 7B of the bottom chassis 7 while the radiating fins 19, mounted to the fin mounting plates 20, are arranged in the height direction and are stacked upon each other.

As mentioned above, the heat-dissipating units 16 having the above-described structure effectively dissipate heat from the central area H of the bottom chassis 7 whose temperature becomes high due to the concentration of the heat generated by convection resulting from the heat generated from the circuit boards 15 or the driving control unit 9, or the many LEDs 11. In each of the heat-dissipating units 16, the heat is conveyed from one end of each heat pipe 18 through the corresponding mounting plate 17 from the central area H of the hot bottom chassis 7. In addition, in each of the heat-dissipating units 16, each heat pipe 18 evaporates the operating liquid at one end thereof to which the heat has been conducted, and causes the resulting gas to move towards the other end, to efficiently convey the heat.

In the heat-dissipating units 16, the heat pipes 18 conduct the heat from the central area H to the peripheral areas L of the bottom chassis 7, and the radiating fins 19, connected to the ends of the heat pipes 18 at the peripheral areas L, dissipate the heat. In addition, in the heat-dissipating units 16, the heat conveyed from the heat pipes 18 is efficiently dissipated from the surfaces of the radiating fins 19. In addition, in the heat-dissipating units 16, the heat pipes 18 efficiently convey heat from the central area H to the peripheral areas L, and cool the central area H, so that the temperature distribution over the entire bottom chassis 7 is made uniform.

In the heat-dissipating units 16, as mentioned above, the radiating fins 19, superimposed upon each other and disposed in the height direction, are disposed at the peripheral areas L of the bottom chassis 7. In the heat-dissipating units 16, the radiating fins 19 are disposed along the direction of convention of the hot air generated in the liquid crystal display device 2, so that even the hot air is efficiently dissipated.

As mentioned above, the driving control unit 9 of the liquid crystal panel unit 3 is disposed at the bottom chassis 7 so as to oppose the top edge of the central area H. In the heat-dissipating units 16, the mounting plates 17 and the heat pipes 18 extend below the driving control unit 9, and the radiating fins 19 are disposed in the left and right peripheral areas L so as to surround the mounting plates 17 and the heat pipes 18. Therefore, in the heat-dissipating units 16, the diffusion of the heat generated from the driving control unit 9 to the interior of the device is restricted. The heat-dissipating units 16 cool the bottom chassis 7 when the driving control unit 9 is directly connected to the bottom chassis 7 through, for example, a heat conduction structure of a heat-dissipation sheet.

In the liquid crystal display device 2, as mentioned above, the backlight unit 1 is assembled to the back surface side of the liquid crystal panel unit 3. In addition, in the liquid crystal display device 2, the backlight unit 1 is assembled to the first principal surface 7A of the bottom chassis 7, and the heat-dissipating units 16 are provided at the second principal surface 7B of the bottom chassis 7. Further, in the liquid crystal display device 2, as described above, the heat-dissipating units 16 include the mounting plates 17 (mounted to the central area H and the lateral peripheral areas L), the heat pipes 18 (mounted to the respective mounting plates 17), and the many radiating fins 19 (mounted to the peripheral areas L of the bottom chassis 7 through the fin mounting plates 20, connected to the ends of the heat pipes 18; and stacked upon each other and integrated to the fin mounting plates 20).

While the liquid crystal display device 2 is operating as a result of supplying electrical power to each portion thereof, heat is generated from, for example, various electronic components, mounted to the driving control unit 9 and the circuit boards 15, and each LED 11, mounted to the light source substrate 6. This causes the internal temperature to rise. In addition, in the liquid crystal display device 2, heat is concentrated at the central area H of the bottom chassis 7 resulting from convection of hot air caused by the heat generated from each of the aforementioned portions in the interior of the liquid crystal display device 2. This causes the central area H to become a high-temperature area. In addition, natural heat dissipation from the peripheral areas L (which are closer to the outer side) become low-temperature areas. Therefore, temperature distribution variations occur.

In the liquid crystal display device 2, as described above, the heat-dissipating units 16 efficiently convey heat from the central area H to the peripheral areas L of the bottom chassis 7 by the mounting plates 17 and the heat pipes 18. In addition, the heat is dissipated from each of the radiating fins 19 at the peripheral areas L. In addition, in the liquid crystal display device 2, the difference between the temperature of the peripheral areas L and that of the central area H of the bottom chassis 7 is reduced by the heat-dissipating units 16, to cause the temperature to be uniform, and to reduce the overall temperature.

In the liquid crystal display device 2, this reduces changes in the characteristics of the LEDs 11 of the backlight unit 1, to stably and efficiently supply illumination light to the entire liquid crystal panel unit 3. Therefore, in the liquid crystal display device 2, it is possible to display an image with high color reproducibility by making uniform the color temperature in the liquid crystal panel unit 3. In addition, in the liquid crystal display device 2, each LED 11, each electronic component, etc., are operated stably and have increased lives.

FIG. 6 shows results of actual measurements of temperature distributions of respective areas for an experimental model 30 in which the heat-dissipating units 16 having the above-described structure are mounted. In the experimental model 30, pairs of left and right units 31 including mounting plates 17 and heat pipes 18 are disposed vertically in two levels so as to be situated slightly above a central area H of a bottom chassis 7, and lateral ends of the heat pipes 18 are connected to dispose a pair of left and right radiating fins 19 in peripheral areas L. The results of the actual measurements of the temperatures of the respective portions in the experimental model 30 show that, at the central area H, the temperature of the portion where each upper unit 31U is disposed is 53.4° C., the temperature of the portion where each lower unit 31L is disposed is 55.8° C., and the temperatures of the portions where the units 31 are not disposed from the lower units 31L to the lower portion of the experimental model 30 are 59.4° C., 59.6° C., and 51.5° C.

The results of actual measurements of the temperatures of portions of radiating fins 19 in peripheral areas L in the experimental model 30 show that the temperature of the portion opposing each upper unit 31U is 53.9° C., the temperature of the portion opposing each lower unit 31L is 57.3° C., and the temperatures of the portions opposing the measured portions of the central area H and where the units 31 are not disposed are 57.3° C., 54.4° C., and 49.3° C. Further, the results of actual measurements of the temperatures of portions opposing the measured portions along outer peripheral edges of the experimental model 30 are 47.7° C., 51.8° C., 51.2° C., 51.5° C., and 43.0° C. As is clear from the aforementioned actual measurement results, in the experimental model 30, it is confirmed that, by providing the heat-dissipating units 16, the temperature difference range is approximately ±10° C. over the entire bottom chassis 7, so that the central area H is cooled and the heat at the central area H and that at the peripheral areas are made uniform.

In the heat-dissipating units 16 of the liquid crystal display device 2, the number of mounting plates 17 and heat pipes 18, and the size and the number of the radiating fins 19 are optimally set on the basis of, for example, simulation results. In all of these cases, in the liquid crystal display device 2, the heat-dissipating units 16 dissipate heat at the central area H, and make uniform the heat of the entire device.

In the above-described embodiment, in the heat-dissipating units 16, the mounting plates 17, to which the heat pipes 18 are mounted, and the fin mounting plates 20, to which the radiating fins 19 are mounted, are separate members; and these separate members are independently mounted to the bottom chassis 7. In the heat-dissipating units 16, such a structure makes it possible to mount the mounting plates 17 and the radiating fins 19 to the bottom chassis 7 by adjusting the positions of the mounting plates 17 and the radiating fins 19 with respect to the bottom chassis 7 on the basis of the optimal conditions based on the simulation results. The present invention is obviously not limited to such a structure.

In FIG. 7, in a heat-dissipating unit 40 according to a second embodiment of the present invention, for example, two heat pipes 41U and 41L are used, and are mounted to mounting plates 42U and 42L by mounting brackets 43, respectively. Radiating fins 45L and 45R (hereunder simply referred to as the "radiating fins 45") are disposed at the heat pipes 41U and 41L on respective sides of a central area H of a bottom chassis 7. The two heat pipes 41U and 41L have lengths extending towards a left peripheral area LL and a right peripheral area LR. Since, in the heat-dissipating unit 40, these structural members are equivalent to the structural members of the above-described heat-dissipating units 16, they will not be described in detail below.

The mounting plate 42U of the heat-dissipating unit 40 is formed with a horizontally long rectangular shape that is slightly longer than the heat pipe 41U, and has fin mounting portions 42U1 and 42U2 at respective ends thereof. The mounting plate 42L of the heat-dissipating unit 40 is also formed with a horizontally long rectangular shape having a length that is equal to the length of the mounting plate 42U, and has fin mounting portions 42L1 and 42L2 at respective ends thereof as shown in FIG. 7. The fin mounting portions 42L1 and 42L2 have widths that are slightly larger than the widths of the radiating fins 45 and are bent into L shapes. In the heat-dissipating unit 40, a mounting structure for mounting the radiating fins 45 to the bottom chassis 7 includes fin mounting plates 44 and the mounting plates 42U and 42L. The fin mounting plates 44 secure the upper portions in the height direction of the radiating fins 45L and 45R. The upper end portions of the radiating fins 45L and 45R are mounted to the bottom chassis 7 through the fin mounting plates 44.

The radiating fins 45L and 45R are mounted to the bottom chassis 7 through the mounting plate 42U by connecting intermediate portions of the radiating fins 45L and 45R to ends of the heat pipe 41U, opposing fitting holes (not shown), and by securing the portions of the radiating fin 45 to the fin mounting portions 42U1 and 42U2 of the mounting plate 42U. The radiating fins 45 are mounted to the bottom chassis 7 through the mounting plate 42L by connecting lower end portions of the radiating fins 45L and 45R to ends of the heat pipe 41L, opposing fitting holes (not shown), and by securing the lower end portions to the fin mounting portions 42L1 and 42L2 of the mounting plate 42L.

In the heat-dissipating unit 40 having the above-described structure, as described above, the mounting plates 42U and 42L serve as mounting members for mounting the heat pipes 41U and 41L and the radiating fins 45 thereto, so that the number of components and the number of mounting operations are reduced, and handling is facilitated. In addition, in the heat-dissipating unit 40, each structural member previously integrated to each other in a separate step is supplied, to mount each structural member to the bottom chassis 7. This reduces the occurrence of, for example, bending of the heat pipes 41 in, for example, a conveyance step. Further, in the heat-dissipating unit 40, it is possible for the above-described mounting plates 42U and 42L to be integrated to the fin mounting plates 44 and to form the mounting members for mounting thereto the heat pipes 41 and the radiating fins 45 into substantially H shapes, though the heat-dissipating unit 40 will be slightly larger as a whole.

Figure 8:
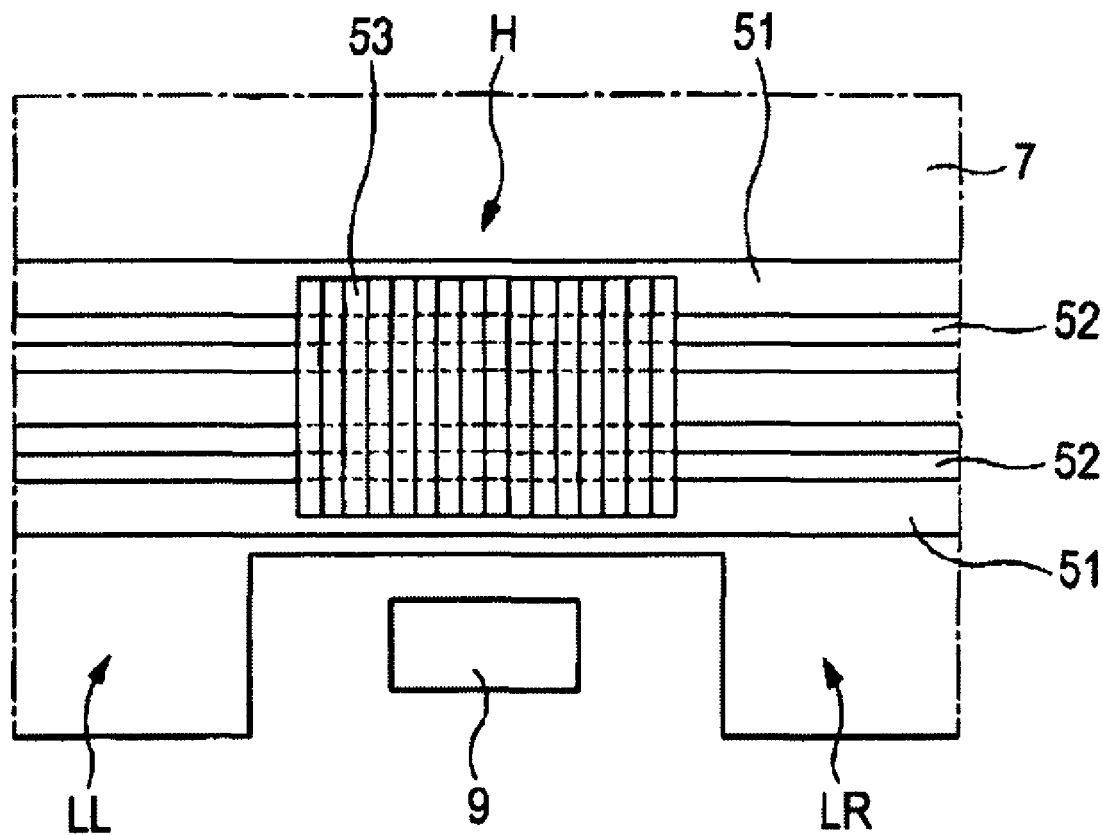
FIG. 8 is a rear view of a main portion of a heat-dissipating unit according to a third embodiment of the present invention.

In FIG. 8, a heat-dissipating unit 50 according to a third embodiment of the present invention is applied to, for example, a liquid crystal display device in which a driving control unit 9 is disposed so as to oppose a portion along a lower edge of a central portion near an electrode draw-out area of a liquid crystal panel unit 3. In the liquid crystal display device, as mentioned above, a large amount of heat is generated from each LED 11, electronic components, of circuit boards 15, etc., as well as the high-performance driving control unit 9. In the liquid crystal display device, the temperature of a central area H of a bottom chassis 7 becomes even higher when heat generated from the driving control unit 9 is directly radiated. In the liquid crystal display device, the heat-dissipating unit 50 efficiently dissipates heat at the central area H of the bottom chassis 7 to make uniform the temperature distribution over the entire bottom chassis 7.

In the liquid crystal display device, the driving control unit 9 is connected to the bottom chassis 7 (not shown) through, for example, a heat conveying unit, such as a heat-dissipating sheet. In addition, the heat-dissipating unit 50 of the liquid crystal display device is disposed on a second principal surface 7B of the bottom chassis 7 so that, a plurality of heat pipes 52, mounted to mounting plates 51, are arranged and disposed horizontally in a central area H and peripheral areas LL and LR. Heat is conveyed from the high-temperature central area H to the low-temperature peripheral areas LL and LR. Even in the heat-dissipating unit 50, radiating fins 53 in which a plurality of rectangular plates are stacked upon each other in the thickness direction and integrally formed are used. The rectangular plates are formed by punching an aluminum sheet metal by, for example, a pressing operation.

The radiating fins 53 are used as mounting members used as the mounting plates 51 of the heat pipes 52. Each radiating fin 53 disposed in the height direction is arranged so as to be positioned at the lower portion of the central area H and so as to oppose the driving control unit 9. The radiating fins 53 are connected to the heat pipes 52 by passing them through fitting holes (not shown), formed in the radiating fins 53 so as to extend therethrough in the thickness direction. Since these structural members of the heat-dissipating unit 50 are equivalent to the structural members of the heat-dissipating unit 16, the structural members of the heat-dissipating unit 50 will not be described in detail.

The heat-dissipating unit 50 having the above-described structure includes the mounting plates 51, the heat pipes 52, and the radiating fins 53. These structural members are mounted to the bottom chassis 7 so as to be disposed at the lower portion of the central area H, and so as to surround the driving control unit 9 connected to the bottom chassis 7 through a heat coupling unit. In the heat-dissipating unit 50, heat is conveyed from the central area H to the peripheral areas LL and LR by the mounting plates 51 and the heat pipes 52. In addition, in the central area H, heat generated from the driving control unit 9 is dissipated by the radiating fins 53. Therefore, in the heat-dissipating unit 50, heat concentration at the central area H is restricted, to stably operate, for example, electronic components of the circuit boards 15 and the driving control unit 9, and to stably drive each LED 11, so that color reproducibility is increased overall.

The present invention is not limited to the liquid crystal television 1 discussed in the aforementioned embodiment, so that, obviously, the present invention is also applicable to various panel display monitor devices.

It should be understood by those skilled in the art that various modifications, combinations, sub-combinations and alterations may occur depending on design requirements and other factors insofar as they are within the scope of the appended claims or the equivalents thereof.

What is claimed is:

1. A light-emitting-diode backlight device comprising:
   a light source substrate to which a plurality of light-emitting diodes are mounted; and
   a bottom chassis having the light source substrate mounted to a principal surface side of the bottom chassis,
   wherein illumination light emitted from each of the light-emitting diodes at the light source substrate is supplied to a display panel unit,
   wherein a back-surface side of the bottom chassis is provided with heat-dissipating means which makes uniform a temperature distribution over the entire bottom chassis, and
   wherein the heat-dissipating means includes a mounting plate, a heat pipe, and a radiating fin, the mounting plate being mounted directly to at least a high-temperature area of the bottom chassis, the heat pipe being disposed on both the high-temperature area and a low-temperature area of the bottom chassis and being mounted to the mounting plate, the radiating fin being mounted directly to the low-temperature area and being directly connected to an end of the heat pipe.

2. The light-emitting-diode backlight device according to claim 1, wherein the heat-dissipating means comprises the mounting plate, the heat pipe, and the radiating fin, the mounting plate being mounted to at least a central area of the bottom chassis, the heat pipe being disposed on both the central area and a peripheral area of the bottom chassis and being mounted to the mounting plate, the radiating fin being mounted to the peripheral area of the bottom chassis and being connected to the end of the heat pipe.

3. The light-emitting-diode backlight device according to claim 1, wherein the heat pipe and the radiating fin, mounted to the end of the heat pipe, are mounted and integrally provided with respect to the mounting plate, to form a heat-dissipating unit, the mounting plate being formed of a metallic plate, and
   wherein the heat-dissipating unit is assembled by mounting the mounting plate to the bottom chassis.

4. The light-emitting-diode backlight device according to claim 1, wherein the radiating fin includes a plurality of metallic plates kept apart from each other and assembled in a thickness direction substantially perpendicular to the plurality of metal plates, and
   wherein the radiating fin is positioned at the low temperature area of the bottom chassis and is disposed in a height direction, and is passed through the end of the heat pipe in the thickness direction to connect the radiating fin to the heat pipe, the heat pipe extending in both the high-temperature area and the low-temperature area through the mounting plate.

5. The light-emitting-diode backlight device according to claim 1, wherein the mounting plate, the heat pipe, and the radiating fin of the heat-dissipating means are disposed so as to surround a mounting position of a driving control unit, the driving control unit being mounted to a lower portion or an upper portion of a central portion in a lengthwise direction of the display panel unit.

6. The light-emitting-diode backlight device according to claim 1, wherein an end of the heat pipe not directly connected to the radiating fin is mounted to the mounting plate.

7. The light-emitting-diode backlight device according to claim 1, further comprising:

a second radiating fin, wherein an end of the heat pipe not directly connected to the radiating fin is directly connected to the second radiating fin.

* * * * *